United States Patent
Shin et al.

(10) Patent No.: US 6,309,903 B2
(45) Date of Patent: Oct. 30, 2001

(54) METHOD FOR MANUFACTURING FRINGE FIELD SWITCHING MODE LIQUID CRYSTAL DISPLAY DEVICE

(75) Inventors: Jae Hak Shin; Sung Hyun Cho, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/732,212

(22) Filed: Dec. 7, 2000

(30) Foreign Application Priority Data

Dec. 22, 1999 (KR) .................................................. 99-60324

(51) Int. Cl.[7] .................................................. H01L 21/00
(52) U.S. Cl. .............................................. 438/30; 438/158
(58) Field of Search ......................................... 438/30, 158

(56) References Cited

FOREIGN PATENT DOCUMENTS

2332769-A * 6/1999 (GB) .

\* cited by examiner

*Primary Examiner*—Richard Booth
*Assistant Examiner*—Angel Roman
(74) *Attorney, Agent, or Firm*—Ladas & Parry

(57) ABSTRACT

A method for manufacturing a fringe field switching mode liquid crystal display device which can improve productivity by reducing the number of steps in the manufacturing process. In this improved method of manufacture, the gate bus line is formed having a stacked structure of a transparent metal layer and an opaque metal layer. In the formation of the gate bus line, the counter electrode is firstly formed, and the active region is formed to cover the gate bus line. Thereafter, the counter electrode is formed by removing the opaque metal layer on the exposed surface of the counter electrode structure. By this method, the gate bus line and the counter electrode structure are formed at the same time thereby reducing the number of mask processes from six, as required by using the conventional manufacturing method, to five.

4 Claims, 5 Drawing Sheets

METHOD FOR MANUFACTURING FRINGE FIELD SWITCHING MODE LIQUID CRYSTAL DISPLAY DEVICE

BACKGROUND OF THE INVENTION

1. Field of the Invention

The present invention relates to a method for manufacturing a fringe field switching mode liquid crystal display device, and in particular to an improved method for manufacturing a fringe field switching mode liquid crystal display device which can reduce steps of the manufacturing process.

2. Description of the Background Art

A fringe field switching mode liquid crystal display device (high aperture ratio and transmissibility liquid crystal display device) has been suggested to improve a low aperture ratio and transmissibility of a general IPS mode liquid crystal display device, and filed in Korea under Application No. 98-9243.

In the fringe field switching mode liquid crystal display device, a counter electrode and a pixel electrode consist of a transparent conductive material. An interval between the counter electrode and the pixel electrode is narrower than an interval between upper and lower substrates. A fringe field is formed at the upper portions of the counter electrode and the pixel electrode.

A conventional method for manufacturing a fringe field switching mode liquid crystal display device will now be described with reference to FIG. 1.

As illustrated in FIG. 1, an indium tin oxide (ITO) layer is formed at the upper portion of a lower transparent insulating substrate 1 according to a sputtering method, by using Ar gas, $O_2$ gas and ITO gas. The ITO layer is patterned to have a comb or plate shape, thereby forming a counter electrode 2 (first mask process).

Thereafter, an opaque metal film is formed according to the sputtering method at the upper portion of the lower substrate 1 where the counter electrode 2 has been formed. A gate bus line 3 and a common electrode line (not shown) are formed by patterning a predetermined portion of the opaque metal film (second mask process).

A gate insulating film 4, an amorphous silicon layer 5 for a channel and a doped amorphous silicon layer 6 are stacked at the upper portion of the transparent insulating film 1 where the gate bus line 3 has been formed, and patterned to have a thin film transistor shape (third mask process).

An ITO layer is deposited over the resultant structure according to the sputtering method, and patterned on the counter electrode 2 to have a comb shape, thereby forming a pixel electrode 7 (fourth mask process).

A pad is opened by removing the gate insulating film on a gate pad unit (fifth mask process).

Thereafter, an opaque metal film is deposited over the resultant structure according to the sputtering method. A source electrode 8a, a drain electrode 8b and a data bus line (not shown) are formed by etching a predetermined portion of the opaque metal film (sixth mask process). The exposed doped amorphous silicon layer 7 is removed according to a publicly known method. Here, the opened gate pad unit and a metal film for a data bus line are contacted.

However, as described above, the conventional method requires six mask processes for forming a lower substrate structure of the fringe field switching mode liquid crystal display device.

Here, the mask process is a photography including a resist spreading process, an exposure process, a developing process, an etching process and a resist removing process. Accordingly, it takes a long time to carry out one mask process.

As a result, a manufacturing time and cost of the fringe field switching mode liquid crystal display device are remarkably increased, and thus a yield thereof is reduced.

SUMMARY OF THE INVENTION

Accordingly, an object of the present invention is to provide a method for manufacturing a fringe field switching mode liquid crystal display device which can improve productivity by reducing steps of a manufacturing process.

In order to achieve the above-described object of the present invention, there is provided a method for manufacturing a fringe field switching mode liquid crystal display device, including the steps of: forming a gate bus line, a counter electrode structure and a gate pad at an edge of a lower substrate, by sequentially stacking a transparent conductive layer and an opaque metal film on the lower substrate, and patterning a predetermined portion thereof; forming an active region by sequentially stacking a gate insulating film, an amorphous silicon layer for a channel and a doped amorphous silicon layer at the upper portion of the lower substrate where the gate bus line and the counter electrode structure have been formed, and patterning the doped amorphous silicon layer and the amorphous silicon layer for the channel to cover the gate bus line; forming a counter electrode by removing the opaque metal film on the exposed counter electrode structure; depositing an insulating film on the resultant structure of the lower substrate; forming a pixel electrode by forming a transparent conductive layer on the insulating film, and patterning the transparent conductive layer in a comb shape to be overlapped with the counter electrode; etching the insulating film to open the gate pad, and simultaneously etching the insulating film in the active region; and forming a data bus line, a source electrode and a drain electrode, by depositing an opaque metal film on the resultant structure of the lower substrate, and patterning the opaque metal film to cross the gate bus line and exist at both sides of the active region, wherein a fringe field being generated when the pixel electrode and the counter electrode have a voltage difference.

Here, the transparent conductive layer is an indium tin oxide (ITO) layer, the opaque metal film for the gate bus line is selected from the group consisting of Mo, Cr, Al and MoW, and the opaque metal film for the data bus line is selected from the group consisting of Mo, Al and Mo/Al/Mo.

According to the present invention, the gate bus line has a stacked structure of the transparent metal layer and the opaque metal layer. In the formation of the gate bus line, the counter electrode structure is firstly formed, and the active region is formed to cover the gate bus line. Thereafter, the counter electrode is formed by removing the opaque metal layer on the exposed surface of the counter electrode structure. Therefore, the gate bus line and the counter electrode structure are formed at the same time, thereby reducing one mask process. As a result, the fringe field switching mode liquid crystal display device can be manufactured by five mask processes.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
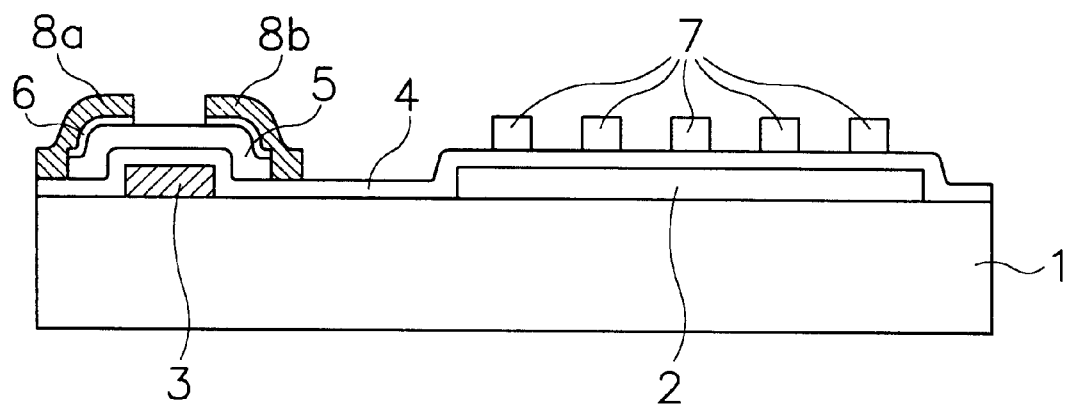
FIG. 1 is a cross-sectional view illustrating a conventional fringe field switching mode liquid crystal display device.

A method for manufacturing a fringe field switching mode liquid crystal display device in accordance with the present invention will now be described with reference to the accompanying drawings.

In the drawings, elements having an identical function are provided with the identical reference numeral, and repeated explanations thereof will be omitted.

FIGS. 2A through 2D are plan views illustrating sequential steps of the method for manufacturing the fringe field switching mode liquid crystal display device, and FIGS. 3A through 3D are cross-sectional views illustrating the sequential steps of the method for manufacturing the fringe field switching mode liquid crystal display device.

Figure 2A:
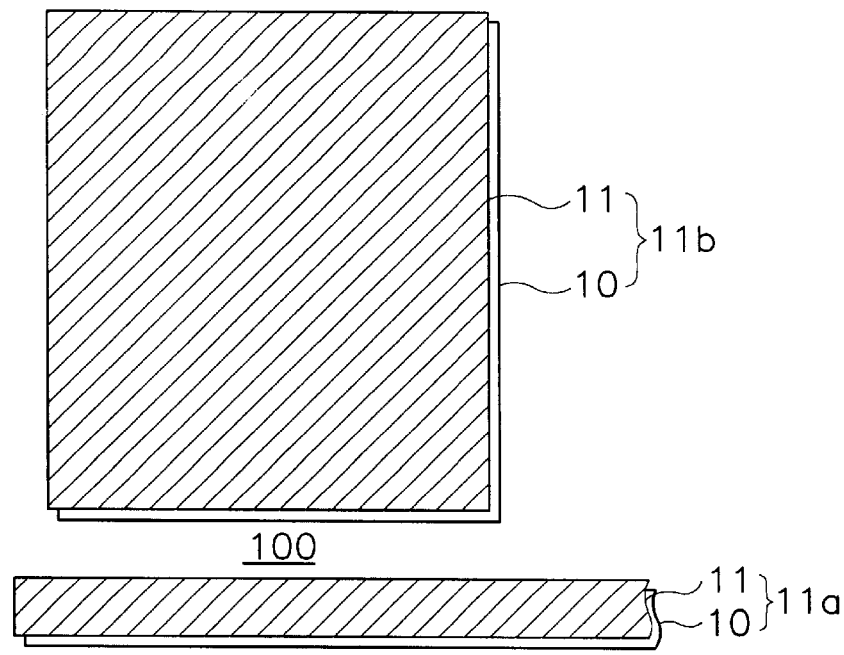
FIGS. 2A through 2D are plan views illustrating sequential steps of a method for manufacturing a fringe field switching mode liquid crystal display device in accordance with the present invention.
Figure 3A:
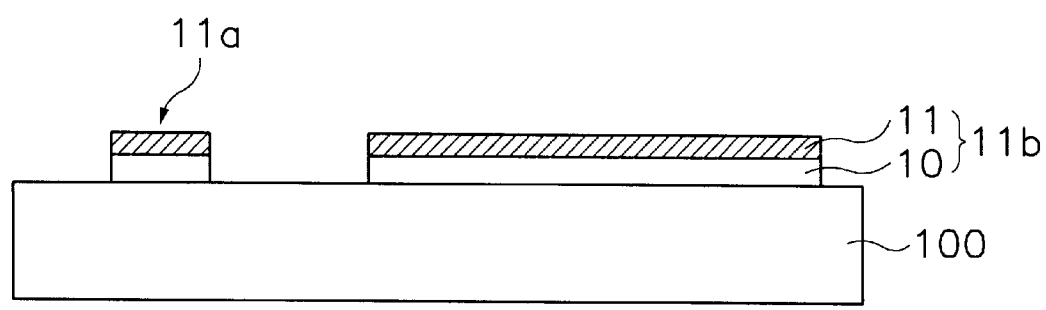
FIGS. 3A through 3D are cross-sectional views illustrating the sequential steps of the method for manufacturing the fringe field switching mode liquid crystal display device in accordance with the present invention.

Referring to FIGS. 2A and 3A, an indium tin oxide (ITO) layer 10 which is a transparent conductive layer and a metal layer 11 for a gate bus line, for example an opaque metal layer such as Mo, Cr, Al and MoW are sequentially formed at the upper portion of a lower substrate 100. The metal film 11 for the gate bus line and the ITO layer 10 are patterned according to a first mask process, thereby forming a gate bus line 11a and a counter electrode structure 11b. Here, the counter electrode structure 11b may be formed in a plate or comb shape. The gate bus line 11a has a stacked structure of the ITO layer 10 and the metal film 11 for the gate bus line. Although not illustrated, when the gate bus line 11a is formed, a gate pad (not shown) is also formed at the edge of the lower substrate 100.

Figure 2B:
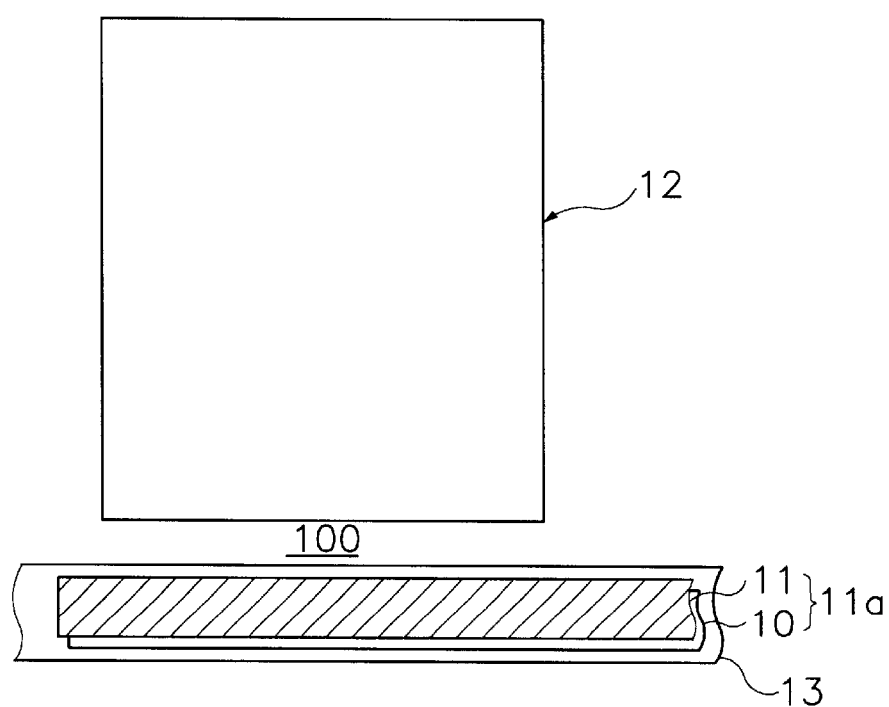
Figure 3B:
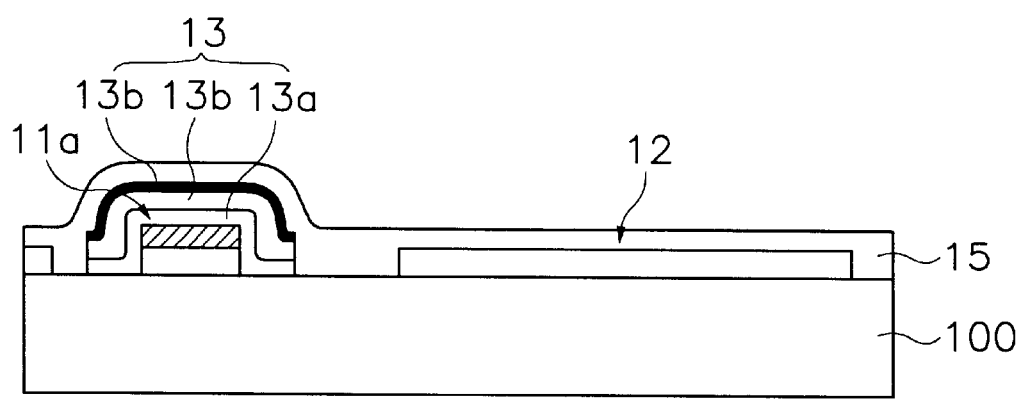

As depicted in FIGS. 2B and 3B, a gate insulating film 13a, an amorphous silicon layer 13b and a doped semiconductor layer 13c are sequentially formed at the upper portion of the lower substrate 100 where the gate bus line 11a and the counter electrode structure 11 have been formed. Thereafter, the doped semiconductor layer 13c, the amorphous silicon layer 13b and the gate insulating film 13a are patterned according to a second mask process to cover the gate bus line 11a, thereby forming an active region 13. Accordingly, the counter electrode structure 11b is exposed and the gate bus line 11a is covered by the active region 13. A counter electrode 12 consisting of a transparent ITO layer is formed by removing the metal film 11 for the gate bus line of the exposed counter electrode structure 11b. An insulating film 15 is deposited on the lower substrate 100 where the counter electrode 12 has been formed.

Figure 2C:
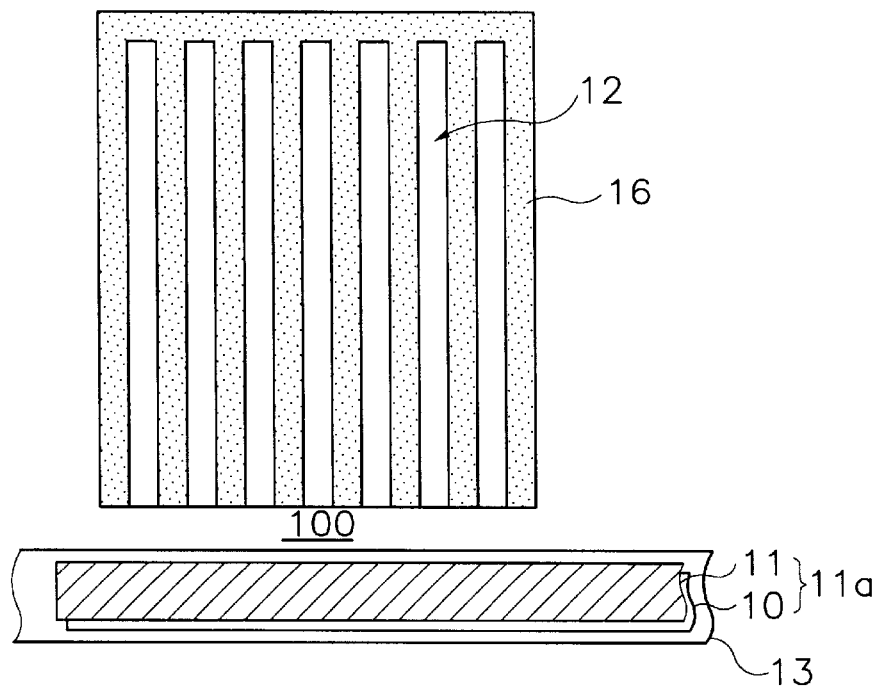
Figure 3C:
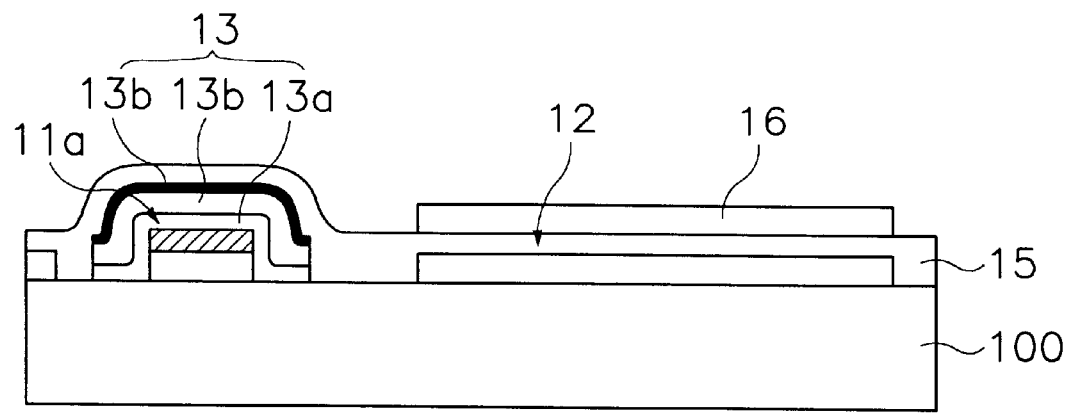

As shown in FIGS. 2C and 3C, an ITO layer for a pixel electrode which is a transparent conductive layer is deposited on the insulating film 15, and then patterned in a comb shape according to a third mask process so that the ITO layer can be overlapped with the counter electrode 12. As a result, the pixel electrode 16 is formed, and thus the lower counter electrode 12 is exposed.

The gate pad (not shown) covered by the insulating film 15 is etched by a fourth mask process, thereby exposing the gate pad. At the same time, the insulating film 15 on the active region 13 is etched.

Figure 2D:
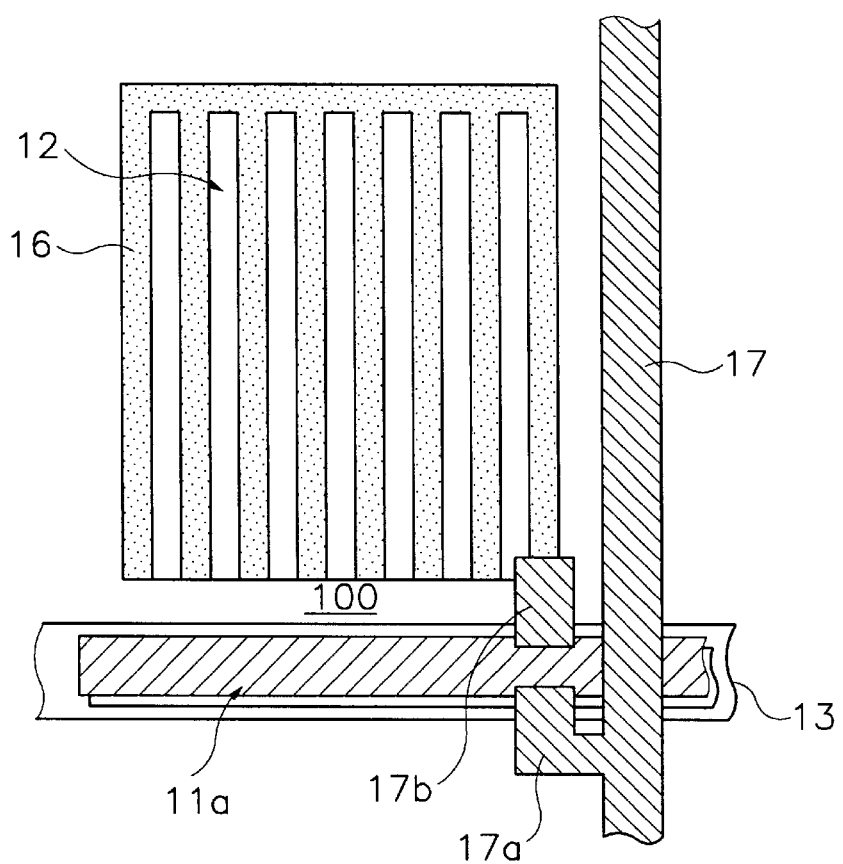
Figure 3D:
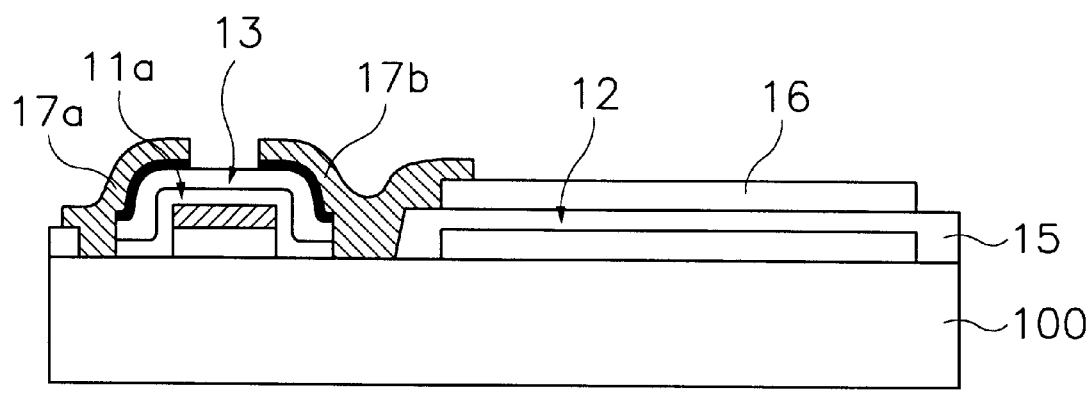

As illustrated in FIGS. 2D and 3D, a metal film for a data bus line, for example an opaque metal film such as Mo, Al and Mo/Al/Mo is deposited on the lower substrate 100. A data bus line 17 crossing the gate bus line 11a, a source electrode 17a extended from the data bus line 17 and contacted with one side portion of the active region 13, and a drain electrode 17b contacted with the other side portion of the active region 13 and a predetermined portion of the pixel electrode 16 are formed by patterning the metal film for the data bus line according to a fifth mask process. Therefore, the fringe field switching mode liquid crystal display device is manufactured according to the five mask processes.

As discussed earlier, in accordance with the present invention, the gate bus line has a stacked structure of the transparent metal layer and the opaque metal layer. In the formation of the gate bus line, the counter electrode structure is firstly formed, and the active region is formed to cover the gate bus line. Thereafter, the counter electrode is formed by removing the opaque metal layer on the exposed surface of the counter electrode structure. Therefore, the gate bus line and the counter electrode structure are formed at the same time, thereby reducing one mask process. As a result, the fringe field switching mode liquid crystal display device can be manufactured by five mask processes.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for manufacturing a fringe field switching mode liquid crystal display device, comprising the steps of:

forming a gate bus line, a counter electrode structure and a gate pad at an edge of a lower substrate, by sequentially stacking a transparent conductive layer and an opaque metal film on the lower substrate, and patterning a predetermined portion thereof;

forming an active region by sequentially stacking a gate insulating film, an amorphous silicon layer for a channel and a doped amorphous silicon layer at the upper portion of the lower substrate where the gate bus line and the counter electrode structure have been formed, and by patterning the doped amorphous silicon layer and the amorphous silicon layer for the channel to cover the gate bus line;

forming a counter electrode by removing the opaque metal film on the exposed counter electrode structure;

depositing an insulating film on the resultant structure of the lower substrate;

forming a pixel electrode by forming a transparent conductive layer on the insulating film, and patterning the transparent conductive layer in a comb shape in order to be overlapped with the counter electrode;

etching the insulating film to open the gate pad, and simultaneously etching the insulating film in the active region; and forming a data bus line, a source electrode and a drain electrode, by depositing an opaque metal film on the resultant structure of the lower substrate, and patterning the opaque metal film to cross the gate bus line and exist at both sides of the active region, wherein a fringe field being generated when the pixel electrode and the counter electrode have a voltage difference.

2. The method according to claim 1, wherein the transparent conductive layer is an indium tin oxide (ITO) layer.

3. The method according to claim 1, wherein the opaque metal film for the gate bus line is selected from the group consisting of Mo, Cr, Al and MoW.

4. The method according to claim 1, wherein the opaque metal film for the data bus line is s elected from the group consisting of Mo, Al and Mo/Al/Mo.

* * * * *